US011672090B2

(12) United States Patent
Yamada et al.

(10) Patent No.: US 11,672,090 B2
(45) Date of Patent: Jun. 6, 2023

(54) ELECTRONIC DEVICE AND STAND

(71) Applicant: PANASONIC INTELLECTUAL PROPERTY MANAGEMENT CO., LTD., Osaka (JP)

(72) Inventors: Genichi Yamada, Osaka (JP); Yohei Kodera, Osaka (JP); Kazuya Honda, Osaka (JP); Naohiro Matsumoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 194 days.

(21) Appl. No.: 17/423,763

(22) PCT Filed: Feb. 7, 2020

(86) PCT No.: PCT/JP2020/004706
§ 371 (c)(1),
(2) Date: Jul. 16, 2021

(87) PCT Pub. No.: WO2021/014664
PCT Pub. Date: Jan. 28, 2021

(65) Prior Publication Data
US 2022/0124927 A1 Apr. 21, 2022

(30) Foreign Application Priority Data
Jul. 19, 2019 (JP) .............................. JP2019-133485

(51) Int. Cl.
*H05K 5/00* (2006.01)
*H05K 5/02* (2006.01)

(52) U.S. Cl.
CPC ......... *H05K 5/0234* (2013.01); *H05K 5/0017* (2013.01)

(58) Field of Classification Search
None
See application file for complete search history.

(56) References Cited

U.S. PATENT DOCUMENTS

| 5,622,025 A | 4/1997 | Kitagawa et al. |
| 7,975,971 B2 * | 7/2011 | Carnevali ............... F16B 47/00 248/205.8 |

(Continued)

FOREIGN PATENT DOCUMENTS

| JP | H06-263106 A | 9/1994 |
| JP | 2008-152242 A | 7/2008 |
| JP | 2009-113899 A | 5/2009 |

OTHER PUBLICATIONS

International Search Report and Written Opinion dated Apr. 21, 2020 in International Patent Application No. PCT/JP2020/004706; with partial English translation.

*Primary Examiner* — Xanthia C Cunningham
(74) *Attorney, Agent, or Firm* — McDermott Will & Emery LLP

(57) ABSTRACT

An electronic device includes a device body and a stand supporting the device body. The stand includes: a base; a suction member facing the lower surface of base, including a suction surface that adheres to the placement surface by negative pressure generated in a gap between the placement surface and the suction surface, and including a ventilation hole in fluid communication with the gap; and a slide valve, located between the base and the suction member, that slides along the lower surface of the base between opened and closed positions where the ventilation hole is opened and closed to let and interrupt air into the gap, respectively.

10 Claims, 11 Drawing Sheets

(56) References Cited

U.S. PATENT DOCUMENTS

| | | | |
|---|---|---|---|
| 8,567,739 B2* | 10/2013 | Zhou | F16M 13/02 |
| | | | 248/397 |
| 9,732,785 B2* | 8/2017 | Kobayashi | F16B 47/00 |
| 10,364,936 B2* | 7/2019 | Lan | G08B 21/18 |
| 2008/0116337 A1 | 5/2008 | Kaneda et al. | |
| 2008/0245935 A1* | 10/2008 | Kaneda | F16M 11/041 |
| | | | 248/206.2 |
| 2009/0114758 A1 | 5/2009 | Yamada | |
| 2013/0248665 A1* | 9/2013 | Koklamanis | F16M 13/022 |
| | | | 248/205.5 |
| 2020/0041828 A1* | 2/2020 | Tsutsumi | G02F 1/1306 |

* cited by examiner

ELECTRONIC DEVICE AND STAND

CROSS-REFERENCE OF RELATED APPLICATIONS

This application is the U.S. National Phase under 35 U.S.C. § 371 of International Patent Application No. PCT/JP2020/004706, filed on Feb. 7, 2020, which in turn claims the benefit of Japanese Application No. 2019-133485, filed on Jul. 19, 2019, the entire disclosures of which Applications are incorporated by reference herein.

TECHNICAL FIELD

The present disclosure relates to an electronic device having a stand and the stand.

BACKGROUND ART

A stand is known that utilizes suction to a placement surface (see, for example, Patent Literature (PTL) 1). The conventional stand includes a suction cup and a suction mechanism for activating and releasing the suction of the suction cup to a placement surface. The suction mechanism largely protrudes from the suction cup in a vertically upward direction.

CITATION LIST

Patent Literature

[PTL 1] Japanese Unexamined Patent Application Publication No. 2008-152242

SUMMARY OF INVENTION

Technical Problem

The present disclosure provides an electronic device and a stand that enable the reduction in the thickness of the stand.

Solution to Problem

The electronic device according to the present disclosure is an electronic device placed on a placement surface, the electronic device including: a device body; and a stand that is placed on the placement surface and supports the device body, wherein the stand includes: a base including a lower surface that faces the placement surface; a suction member that is elastic, faces the lower surface of the base, includes a suction surface that adheres to the placement surface by negative pressure generated in a gap between the placement surface and the suction surface, and includes a ventilation hole that is in fluid communication with the gap; and a slide valve that is located between the base and the suction member and slides between an opened position and a closed position along the lower surface of the base, the opened position being a position at which the ventilation hole is opened to let air into the gap, the closed position being a position at which the ventilation hole is closed to interrupt air into the gap, and when the slide valve is in the closed position, the suction member generates the negative pressure in the gap by elastically deforming in a direction away from the placement surface when the stand is under an external force acting in the direction away from the placement surface.

Advantageous Effects of Invention

The electronic device according to the present disclosure enables the reduction in the thickness of the stand.

DESCRIPTION OF EMBODIMENTS

The following describes in detail the embodiment with reference to the drawings where necessary. Note that a more detailed description than is necessary can be omitted. For example, detailed description of a well-known matter or repetitive description of substantially the same configuration can be omitted. This is to prevent the following description from becoming unnecessarily redundant and facilitate the understanding of those skilled in the art.

Also note that the inventors provide the accompanying drawings and the following description for those skilled in the art to fully understand the present disclosure, and thus that these do not intend to limit the subject recited in the claims.

Embodiment

With reference to FIG. 1 through FIG. 8B, the embodiment will be described. In FIG. 1 through FIG. 8B, the width direction of electronic device 2 is defined as the X axis direction, the depth direction of electronic device 2 is defined as the Y axis direction, and the height direction of electronic device 2 is defined as the Z axis direction. In the following description, the depth direction of electronic device 2 is also referred to simply as "the depth direction".

[1. Configuration of Electronic Device]

Figure 1:
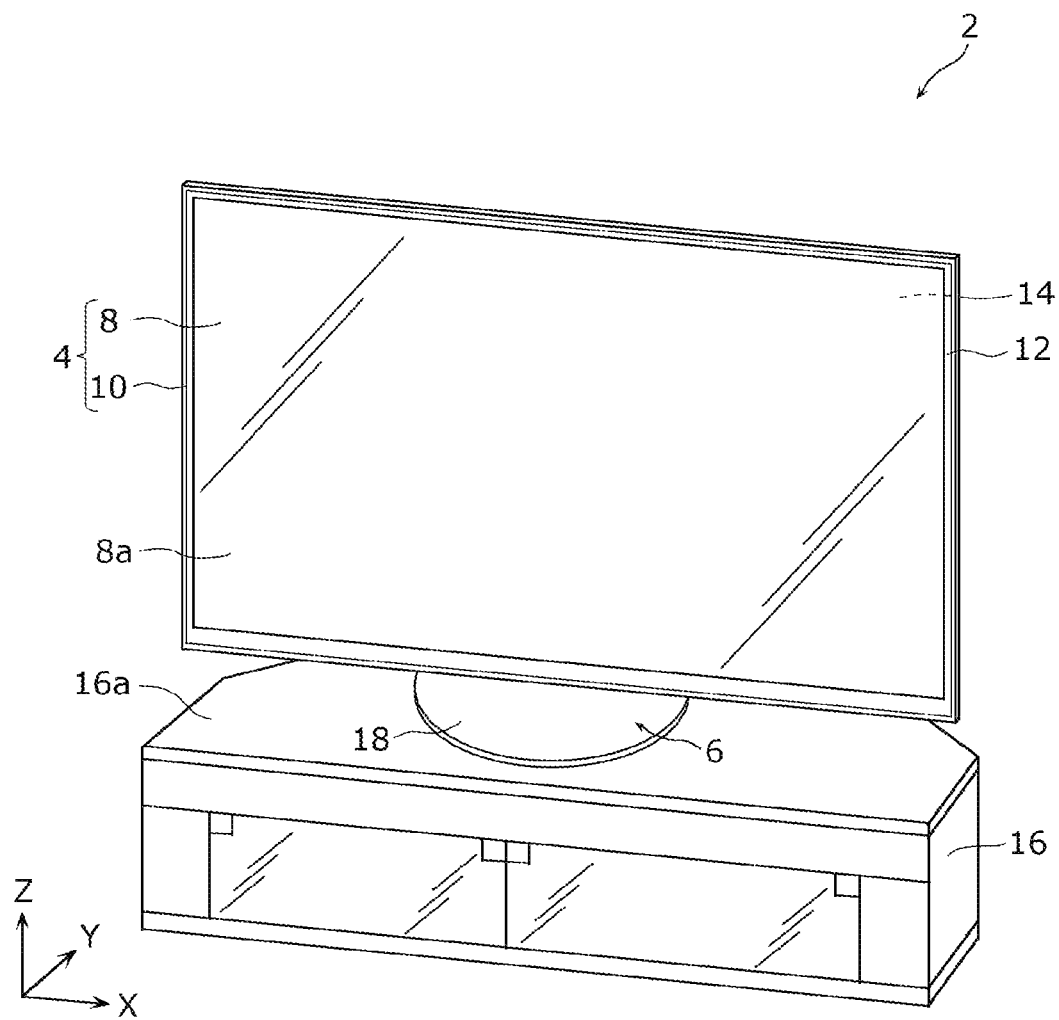
FIG. 1 is a perspective view of an electronic device according to an embodiment.

With reference to FIG. 1, the following describes the configuration of electronic device 2 according to the embodiment. FIG. 1 is a perspective view of electronic device 2 according to the embodiment.

As shown in FIG. 1, electronic device 2 is, for example, an image display device such as a liquid crystal television receiver. Electronic device 2 includes device body 4 and stand 6.

Device body 4 is a display unit having a panel shape. Device body 4 includes display panel 8 and cabinet 10.

Display panel 8 is located inside of cabinet 10. Display panel 8 includes display surface 8a for image display at the front of display panel 8.

Cabinet 10 includes front cabinet 12 and rear cabinet 14. Front cabinet 12, which has a rectangular frame shape, is located to cover the outer portion of display panel 8. Rear cabinet 14 is located to cover the entirety of the back surface of display panel 8 (the surface opposite to display surface 8a). Rear cabinet 14 is connected to front cabinet 12.

Note that in the present embodiment, the depth direction means the thickness direction of device body 4 (the Y axis direction). Also, the front side in the depth direction means the side of display panel 8 (the negative side of the Y axis), and the back side in the depth direction means the side of rear cabinet 14 (the positive side of the Y axis).

Stand 6, which supports device body 4 from below, is attached to rear cabinet 14. Stand 6 is placed, for example, on placement surface 16a located on the top surface of placement table 16 (so-called a television table). Note that placement surface 16a is a plane surface that is substantially parallel to, for example, the XY plane (the horizontal plane). The following describes in detail the configuration of stand 6.

[2. Configuration of Stand]
[2-1. Overall Configuration of Stand]

Figure 2:
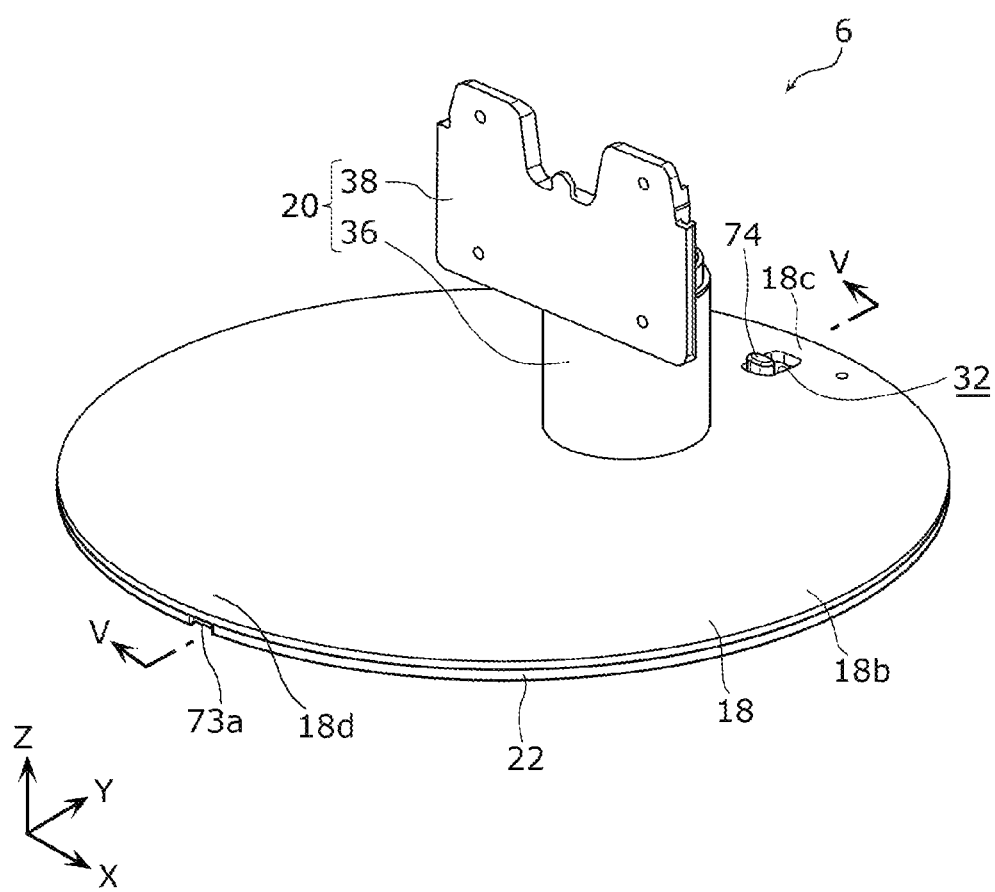
FIG. 2 is a perspective view of a stand according to the embodiment.
Figure 3:
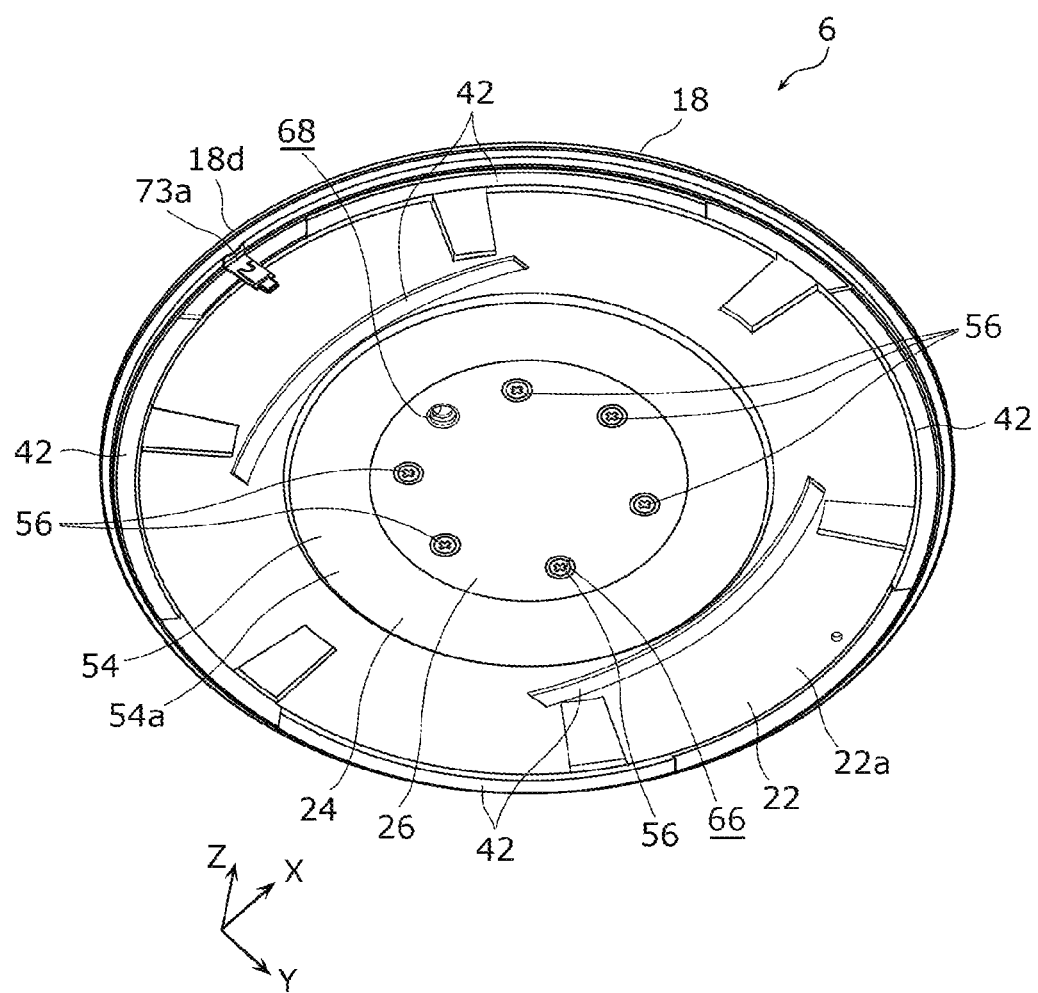
FIG. 3 is a perspective view of the stand according to the embodiment viewed from a different angle from that of FIG. 2.
Figure 4:
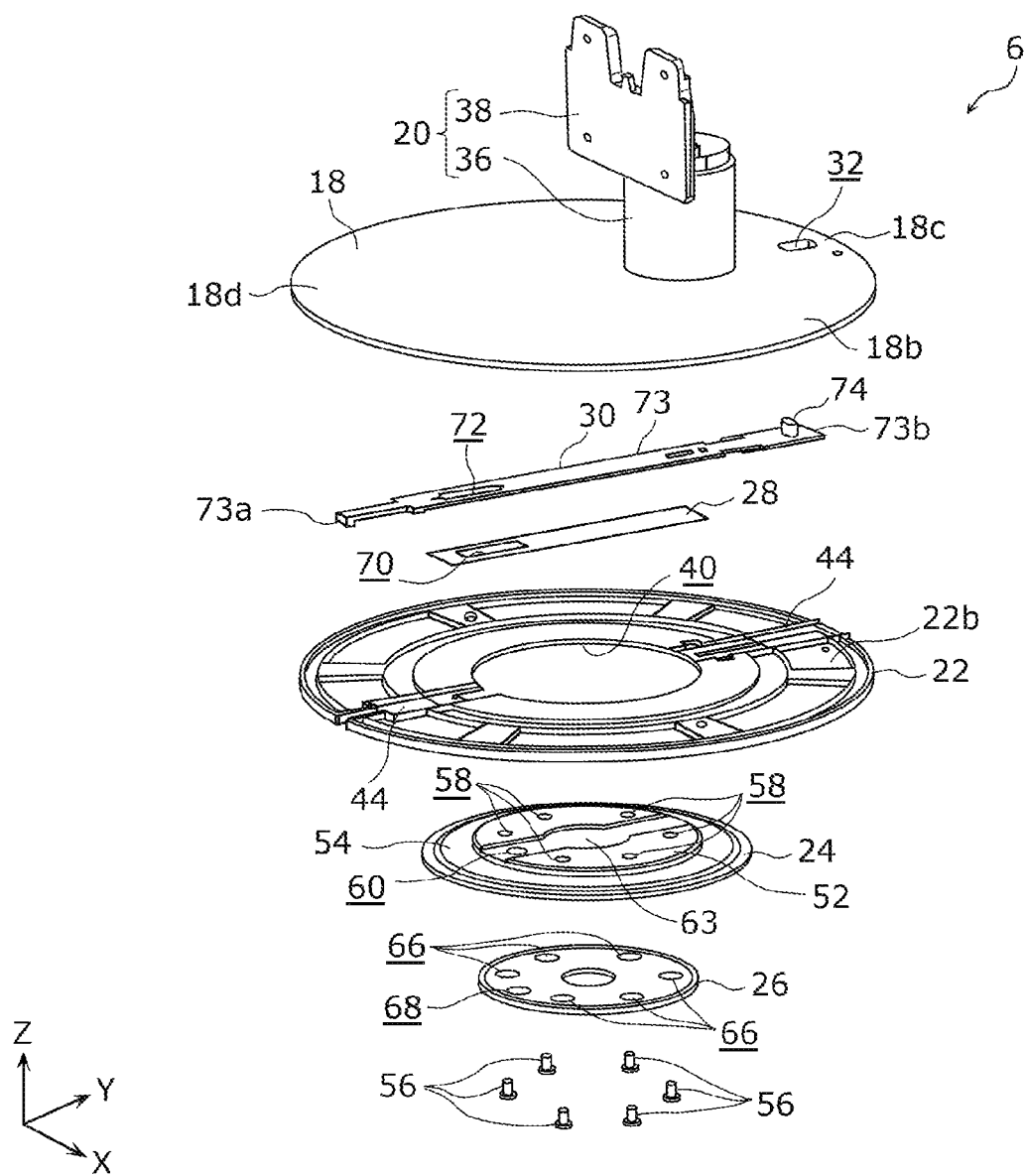
FIG. 4 is an exploded perspective view of the stand according to the embodiment in a disassembled state.

With reference to FIG. 2 through FIG. 4, the overall configuration of stand 6 according to the embodiment will be described. FIG. 2 is a perspective view of stand 6 according to the embodiment. FIG. 3 is a perspective view of stand 6 according to the embodiment viewed from a different angle from that of FIG. 2. FIG. 4 is an exploded perspective view of stand 6 according to the embodiment in a disassembled state.

As shown in FIG. 2 through FIG. 4, stand 6 includes base 18, stand neck 20, holding cover 22, suction member 24, holder 26, slip sheet 28, and slide valve 30. The following describes the structural components of stand 6.

[2-2. Base]

Figure 5A:
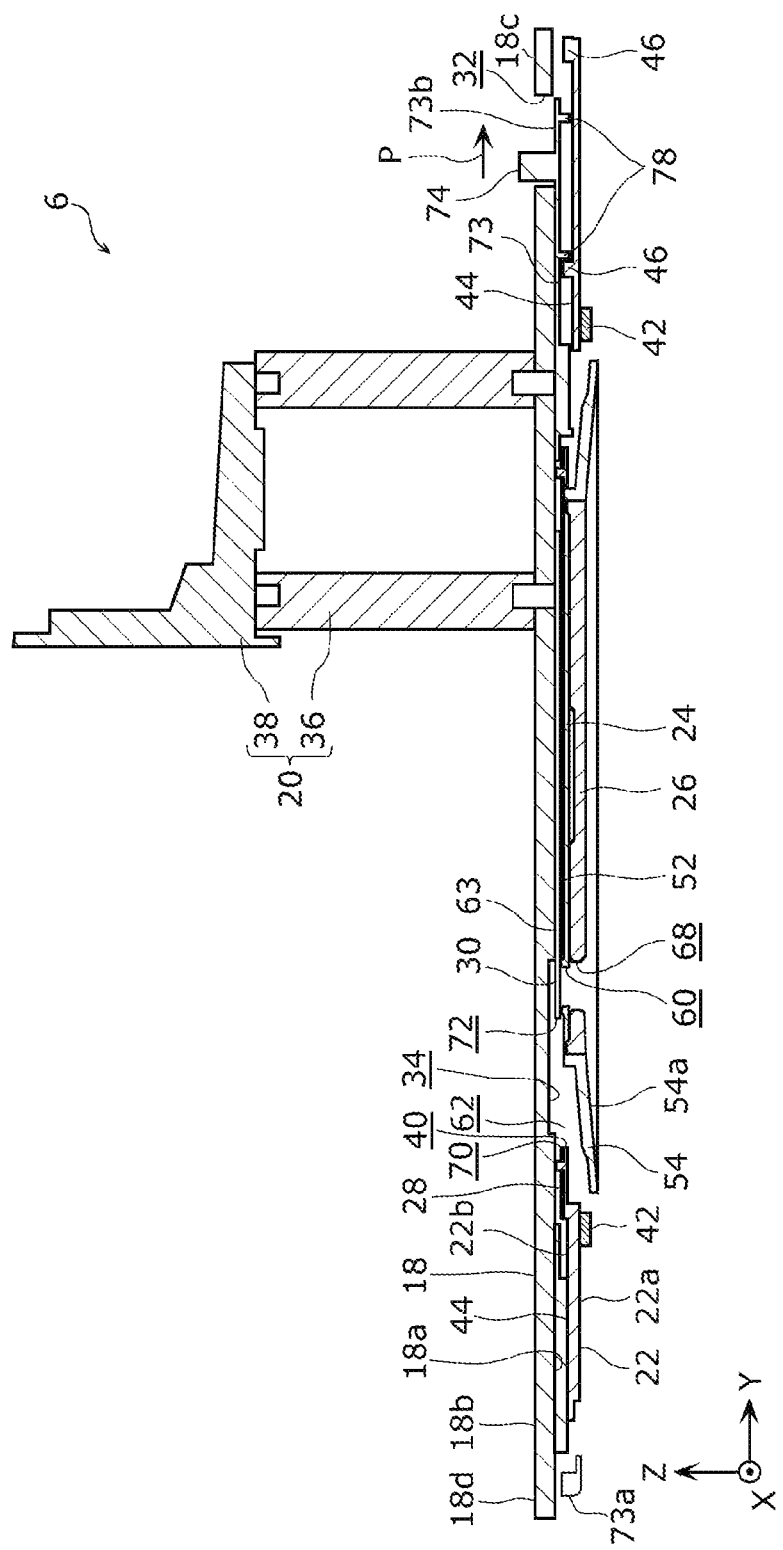
FIG. 5A is a cross-sectional view of the stand according to the embodiment cut along V-V line in FIG. 2 when a slide valve is in a closed position.
Figure 5B:
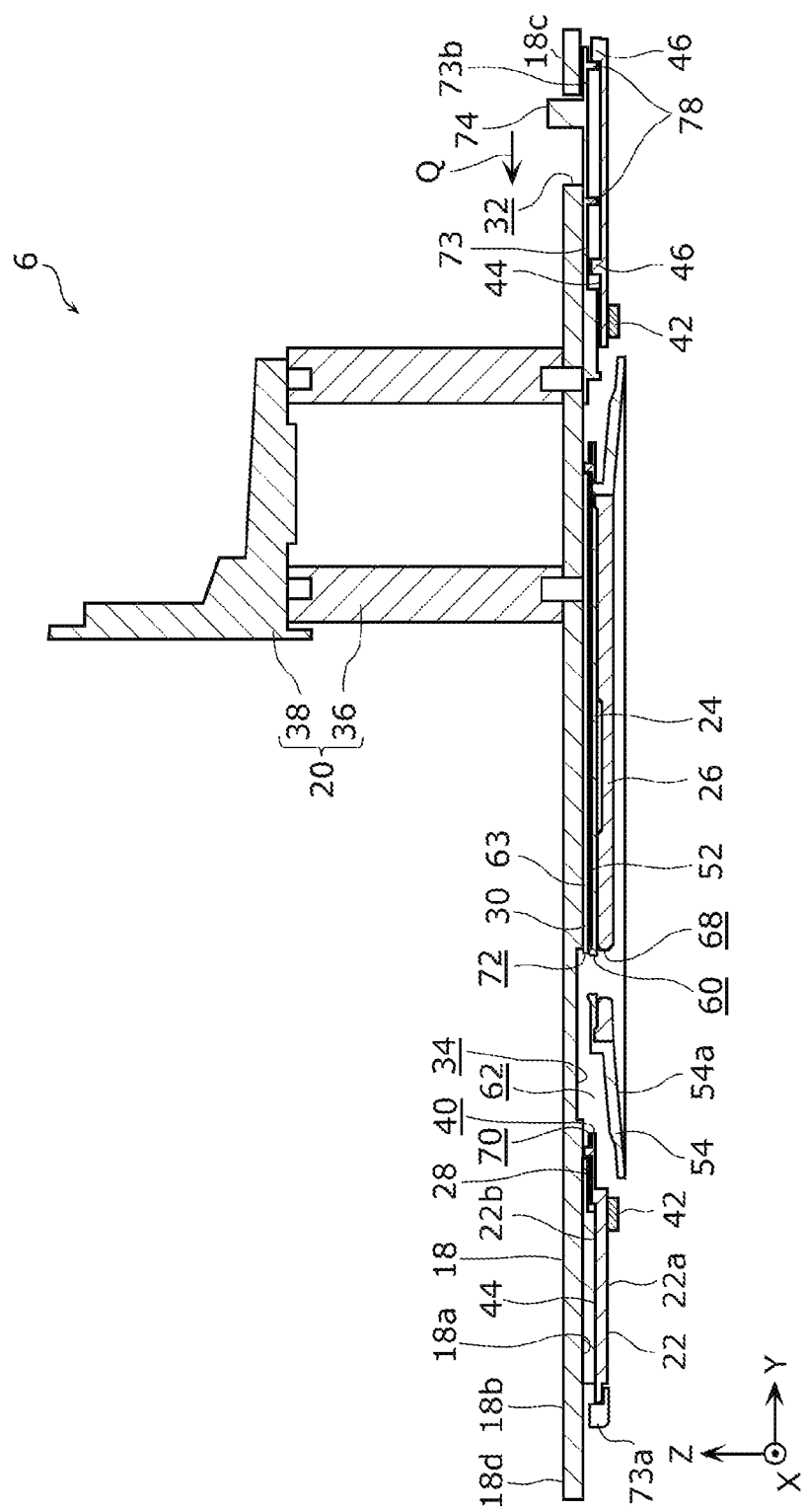
FIG. 5B is a cross-sectional view of the stand according to the embodiment cut along V-V line in FIG. 2 when the slide valve is in an opened position.

With reference to FIG. 2, and FIG. 4 through FIG. 5B, base 18 will be described. FIG. 5A is a cross-sectional view of stand 6 according to the embodiment cut along V-V line in FIG. 2 when slide valve 30 is in the closed position. FIG. 5B is a cross-sectional view of stand 6 according to the embodiment cut along V-V line in FIG. 2 when slide valve 30 is in the opened position.

As shown in FIG. 2, and FIG. 4 through FIG. 5B, base 18, which is a base placed on placement surface 16a (see FIG. 1), comprises, for example, a metal plate having a circular shape in a plan view of the XY plane.

Base 18 includes insertion hole 32 at end portion 18c of base 18 at the back side in the depth direction. Stated differently, insertion hole 32 is located in a displaced position at the back side of base 18 in the depth direction with respect to the diameter center of base 18. Knob 74 of slide valve 30 (to be described later) is inserted in insertion hole 32 in a manner that knob 74 is movable in the depth direction.

Figure 7:
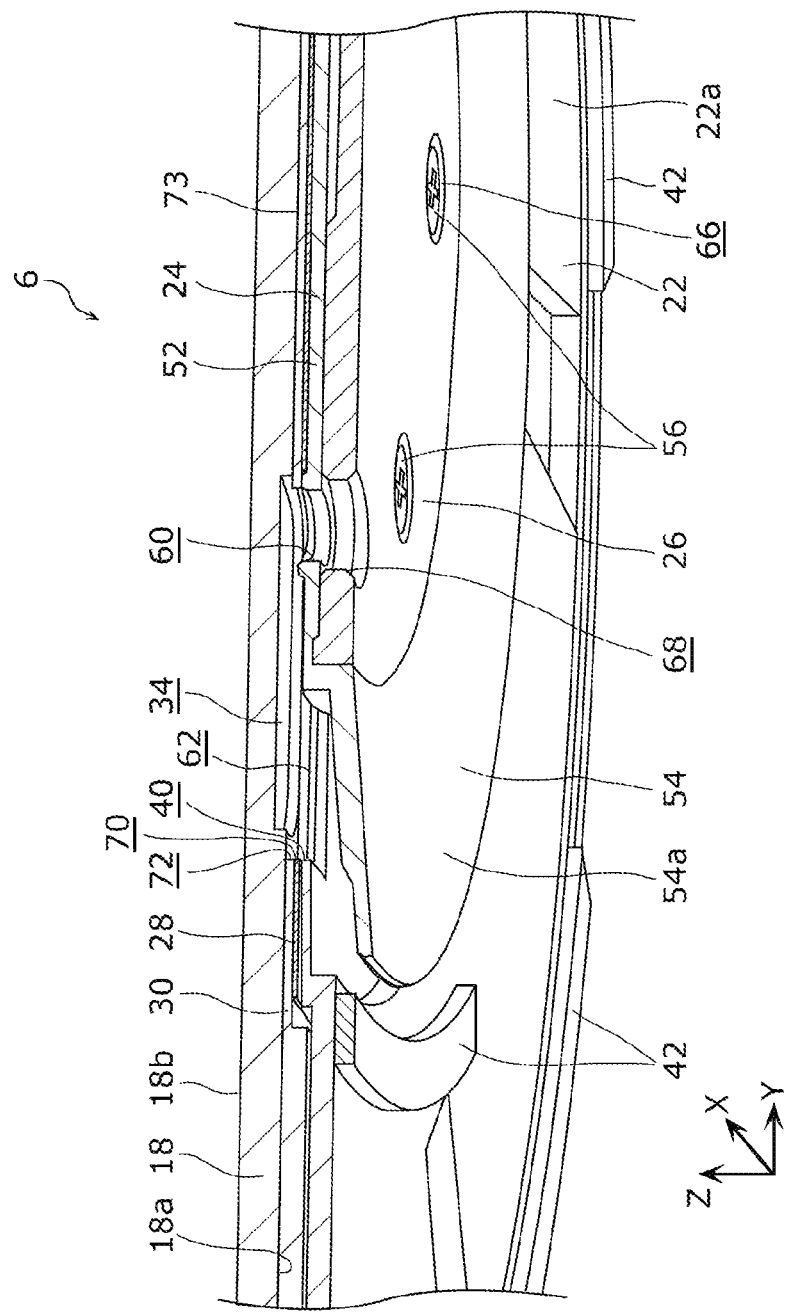
FIG. 7 is a cross-sectional perspective view of an enlarged part of the stand shown in FIG. 5B.

Located in lower surface 18a of base 18 are a plurality of screw holes (not illustrated) into which a plurality of screws (see FIG. 3 and FIG. 4) are screwed. Note that lower surface 18a of base 18 is the surface that faces placement surface 16a. Also, as shown in FIG. 5A, FIG. 5B, and FIG. 7 to be described later, lower surface 18a of base 18 includes recessed portion 34 (to be described later).

[2-3. Stand Neck]

With reference to FIG. 2, and FIG. 4 through FIG. 5B, stand neck 20 will be described. Stand neck 20 is a member for supporting device body 4 (see FIG. 1).

As shown in FIG. 2, and FIG. 4 through FIG. 5B, stand neck 20 includes column portion 36 and bracket 38. Column portion 36, which has a circular cylindrical shape, for example, is vertically provided on upper surface 18b of base 18 (the surface opposite to lower surface 18a). Column portion 36 is located on upper surface 18b of base 18, between the diameter center of base 18 and insertion hole 32. Bracket 38, which is located on the upper end portion of column portion 36, is attached to rear cabinet 14 of device body 4.

Note that stand neck 20 may have a swiveling function of adjusting the orientation of display surface 8a of device body 4 with respect to base 18 within a predetermined range of angles. In this case, bracket 38 is configured to rotate about the central axis of column portion 36 within the predetermined range of angles with respect to column portion 36.

[2-4. Holding Cover]

Figure 6A:
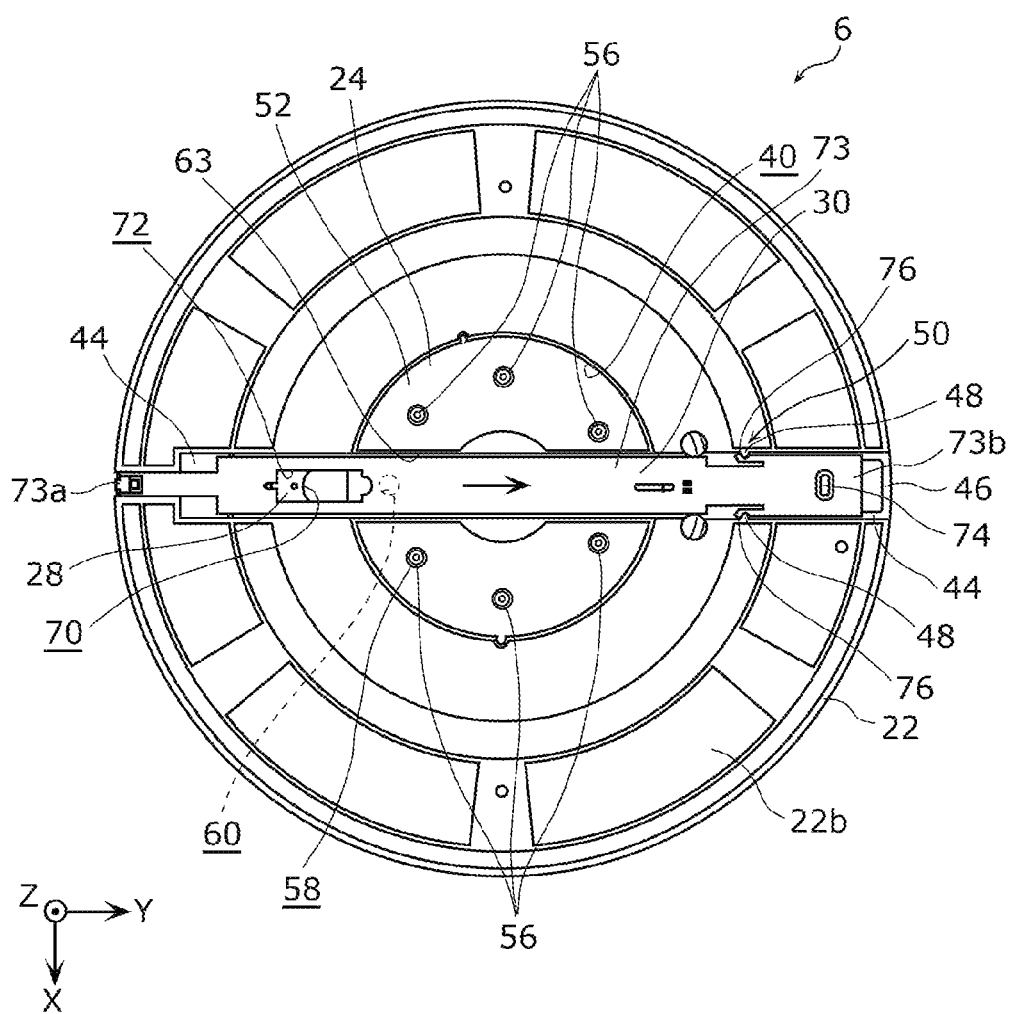
FIG. 6A is a plan view of the stand according to the embodiment when the slide valve is in the closed position and a base and a stand neck are not illustrated.
Figure 6B:
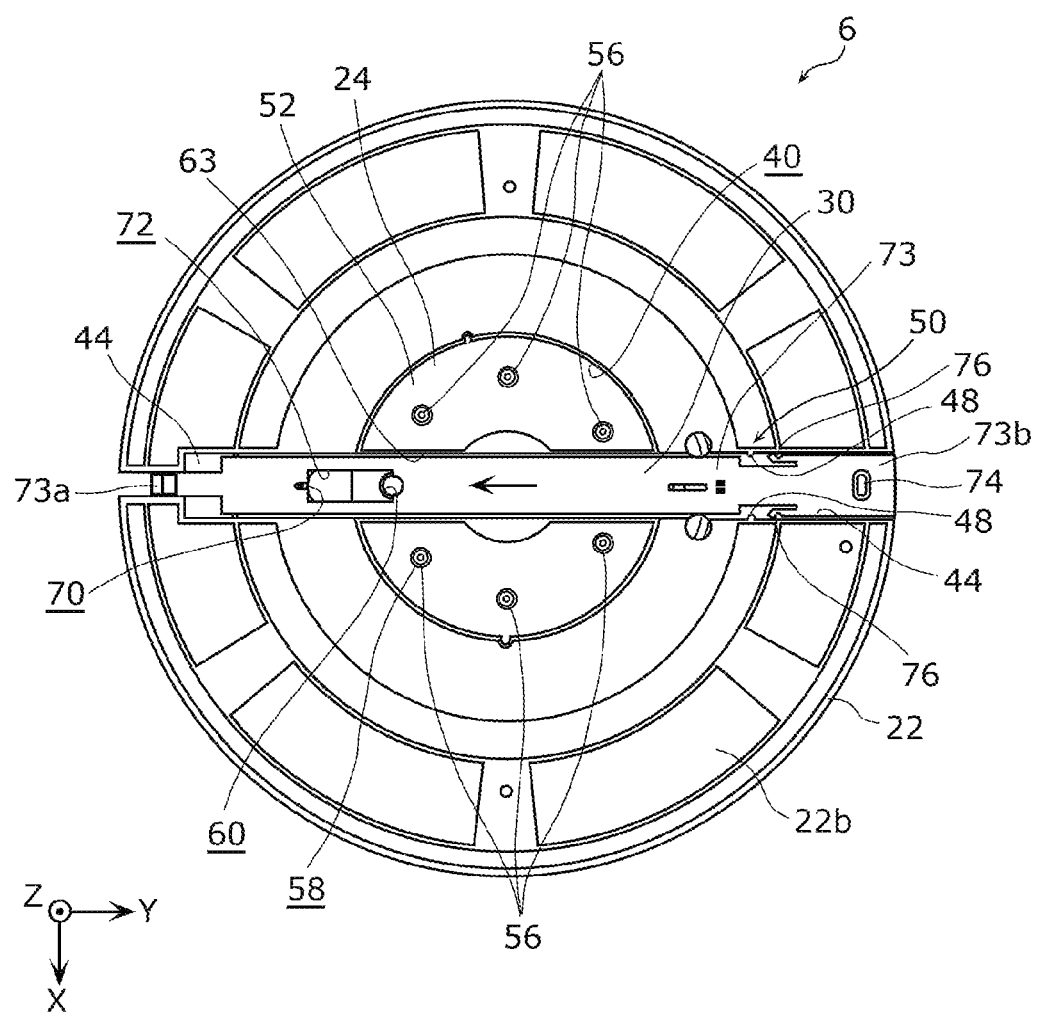
FIG. 6B is a plan view of the stand according to the embodiment when the slide valve is in the opened position and the base and the stand neck are not illustrated.

With reference to FIG. 3 through FIG. 6B, holding cover 22 will be described. FIG. 6A is a plan view of stand 6 according to the embodiment when slide valve 30 is in the closed position and base 18 and stand neck 20 are not illustrated. FIG. 6B is a plan view of stand 6 according to the embodiment when slide valve 30 is in the opened position and base 18 and stand neck 20 are not illustrated.

Holding cover 22, which is a member for keeping slide valve 30 slidable along the depth direction, comprises, for example, resin. As shown in FIG. 4 through FIG. 5B, holding cover 22 has, for example, a circular ring shape in a plan view of the XY plane. Holding cover 22 is located to face lower surface 18a of base 18. Holding cover 22 includes, at its central portion, opening portion 40 having a circular shape for attaching suction member 24 to lower surface 18a of base 18.

As shown in FIG. 3, FIG. 5A, and FIG. 5B, holding cover 22 includes a plurality of non-slip rubber feet 42 attached on lower surface 22a of holding cover 22. Note that lower surface 22a of holding cover 22 is the surface that faces placement surface 16a.

As shown in FIG. 4, FIG. 6A, and FIG. 6B, groove portion 44 that extends along the depth direction is located in upper surface 22b of holding cover 22 (the surface opposite to lower surface 22a). Groove portion 44 extends from the inner periphery to the outer periphery of holding cover 22. Slide valve 30 is located in groove portion 44 in a manner that slide valve 30 is slidable along the longitudinal direction (the Y axis direction) of groove portion 44.

Also, as shown in FIG. 5A and FIG. 5B, groove portion 44 includes a pair of stoppers 46 for regulating the range in which slide valve 30 slides. A pair of stoppers 46 are located spaced apart from each other along the longitudinal direction of groove portion 44.

As shown in FIG. 6A and FIG. 6B, groove portion 44 further includes a pair of protruded portions 48. A pair of protruded portions 48 are located to face each other in the lateral direction (the X axis direction) of groove portion 44. A pair of protruded portions 48 and a pair of engagement portions 76 of slide valve 30 (to be described later) are included in engagement mechanism 50 for providing tactile feedback in an operation of sliding slide valve 30.

[2-5. Suction Member]

With reference to FIG. 3 through FIG. 7, suction member 24 will be described. FIG. 7 is a cross-sectional perspective view of an enlarged part of stand 6 shown in FIG. 5B.

Suction member 24 is a member that adheres to placement surface 16a by suction, thereby preventing electronic device 2 (see FIG. 1) from falling over. Suction member 24 has a sheet shape in the thickness, for example, of some 1 mm to a few mm. Suction member 24 comprises, for example, an elastic material such as silicon, urethane, and rubber. As shown in FIG. 4 through FIG. 5B, suction member 24 includes attachment portion 52 and suction portion 54.

Attachment portion 52 has, for example, a circular shape in a plan view of the XY plane. As shown in FIG. 5A through FIG. 6B, attachment portion 52 is inserted in opening portion 40 of holding cover 22 to face lower surface 18a of base 18. More specifically, attachment portion 52 is supported by being sandwiched between lower surface 18a of base and holder 26. As shown in FIG. 5B, air admission opening 62 that is in fluid communication with opening portion 72 of slide valve 30 (to be described later) is located between the outer periphery of attachment portion 52 and the outer periphery of opening portion 40 of holding cover 22.

As shown in FIG. 4, FIG. 6A, and FIG. 6B, attachment portion 52 includes a plurality of holes 58 into which a plurality of screws 56 are inserted. A plurality of holes 58 are located at intervals in a circumferential direction of attachment portion 52 in one-to-one correspondence with a plurality of screw holes located in lower surface 18a of base 18. Attachment portion 52 further includes ventilation hole 60 that penetrates through attachment portion 52 in the thickness direction of attachment portion 52 (the Z axis direction). Ventilation hole 60 has, for example, a circular shape in a plan view of the XY plane. As shown in FIG. 7, ventilation hole 60 is located to face recessed portion 34 located in lower surface 18a of base 18.

As shown in FIG. 4, FIG. 6A, and FIG. 6B, groove portion 63 that extends along the depth direction is located in upper surface of attachment portion 52 (the surface that faces lower surface 18a of base 18). Groove portion 63 extends continuously from groove portion 44 of holding cover 22. Slide valve 30 is located in groove portion 63 in a manner that slide valve 30 is slidable along the longitudinal direction (the Y axis direction) of groove portion 63. Also, ventilation hole 60 described above is located in groove portion 63.

As shown in FIG. 4 through FIG. 5B, suction portion 54 extends from the outer periphery of attachment portion 52 in an outer radial direction in a skirt (umbrella) shape. As shown in FIG. 3, located on the lower surface of suction portion 54 is suction surface 54a having, for example, a circular ring shape in a plan view of the XY plane.

Figure 8A:
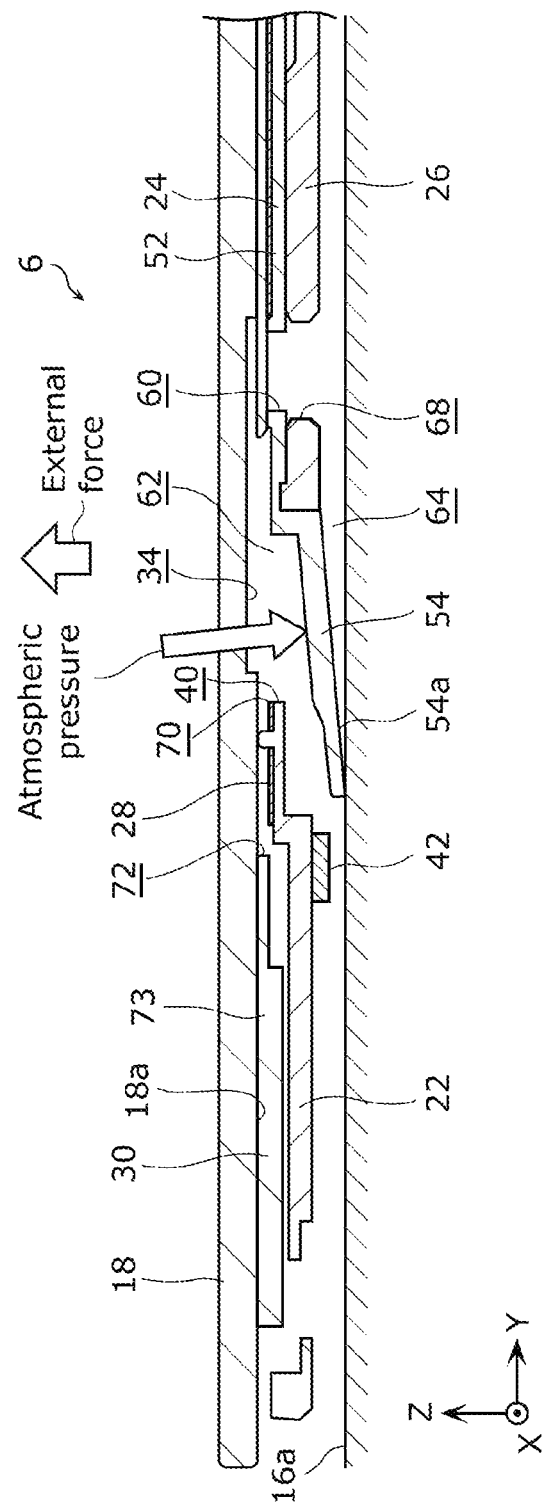
FIG. 8A is a diagram for explaining an operation of the stand according to the embodiment when the slide valve is in the closed position.

As shown in FIG. 8A to be described later, when base 18 is placed on placement surface 16a, the outer portion of suction surface 54a of suction portion 54 adheres to (contacts) placement surface 16a by suction, thereby creating gap 64 between the lower surface of holder 26 and placement surface 16a and between the inner portion of suction surface 54a of suction portion 54 and placement surface 16a. Ventilation hole 60 of suction member 24 is in fluid communication with gap 64 via ventilation hole 68 of holder 26 (to be described later).

[2-6. Holder]

With reference to FIG. 3 through FIG. 5B, holder 26 will be described. Holder 26 is a member for attaching suction member 24 to lower surface 18a of base 18.

As shown in FIG. 3 and FIG. 4, holder 26 has, for example, a circular shape in a plan view of the XY plane. Holder 26 includes a plurality of holes 66 into which a plurality of screws 56 are inserted. A plurality of holes 66 are located at intervals in a circumferential direction of holder 26 in one-to-one correspondence with a plurality of screw holes located in lower surface 18a of base 18.

As shown in FIG. 3 through FIG. 5B, holder 26 includes ventilation hole 68 that is in fluid communication with ventilation hole 60 of attachment portion 52 of suction member 24. Ventilation hole 68 has, for example, a circular shape in a plan view of the XY plane. The diameter of ventilation hole 68 is larger than the diameter of ventilation hole 60 of attachment portion 52. Note that the diameter of ventilation hole 68 may be the same as the diameter of ventilation hole 60 of attachment portion 52. Also note that ventilation hole 68 may have a tapered shape in which its diameter becomes larger or smaller toward ventilation hole 60 of attachment portion 52.

With holder 26 contacting the lower surface of attachment portion 52 of suction member 24, a plurality of screws 56 are screwed into a plurality of screw holes of base 18 through a plurality of holes 66 of holder 26 and a plurality of holes 58 of attachment portion 52 of suction member 24. This enables attachment portion 52 of suction member 24 to be attached to lower surface 18a of base 18 in holder 26.

[2-7. Slip Sheet]

With reference to FIG. 4 through FIG. 5B, slip sheet 28 will be described. Slip sheet 28 is intended for improving the slip property of slide valve 30 to suction member 24.

Slip sheet 28 is a sheet having a long-length shape in the thickness, for example, of 1 mm or below. Slip sheet 28 comprises, for example, a slippery material such as polyethene terephthalate. As shown in FIG. 4, slip sheet 28 includes opening portion 70 that extends in the longitudinal direction (the Y axis direction) of slip sheet 28.

As shown in FIG. 5A and FIG. 5B, slip sheet 28 is attached to groove portion 63 of attachment portion 52 of suction member 24 and groove portion 44 of holding cover 22. Slip sheet 28 is located between slide valve 30 and suction member 24. Slip sheet 28 with this configuration enables slide valve 30 to be located without contact with at least attachment portion 52 of suction member 24. Opening portion 70 of slip sheet 28 is in fluid communication with ventilation hole 60 of suction member 24 and air admission opening 62.

Note that a protruded portion (not illustrated) having a circular ring shape is located in the peripheral portion of ventilation hole 60 of attachment portion 52 of suction member 24. This protruded portion presses the lower surface of slide valve 30 (the surface that faces suction member 24) via opening portion 70 of slip sheet 28. This configuration enables slide valve 30 to slide between the closed position and the opened position to be described later, pressing the protruded portion. Consequently, ventilation hole 60 of suction member 24 is closed when slide valve 30 is in the closed position. This configuration also enables slide valve 30 to smoothly slide without running on the protruded portion when slide valve 30 slides from the opened position to the closed position.

[2-8. Slide Valve]

With reference to FIG. 2 through FIG. 7, slide valve 30 will be described. Slide valve 30 is a changeover valve for letting in or stop the air into gap 64 (see FIG. 8A and FIG. 8B to be described later).

As shown in FIG. 5A and FIG. 5B, slide valve 30 comprises, for example, resin. Slide valve 30 is located between base 18 and suction member 24. As shown in FIG. 4, FIG. 6A and FIG. 6B, slide valve 30 includes valve body 73 and knob 74.

Valve body 73 has a long thin plate shape in the thickness of, for example, some 1 mm to 2 mm. Valve body 73 is located in groove portion 44 of holding cover 22 and in groove portion 63 of attachment portion 52 of suction member 24 via slip sheet 28.

Sliding on slip sheet 28, valve body 73 slides between the closed position and the opened position along lower surface 18a of base 18 in the depth direction. As shown in FIG. 5A and FIG. 6A, the closed position is a position at which valve body 73 closes ventilation hole 60 of suction member 24 to interrupt the flow of air into gap 64 (see FIG. 8A and FIG. 8B to be described later). As shown in FIG. 5B, FIG. 6B, and FIG. 7, the opened position is a position at which valve body 73 opens ventilation hole 60 of suction member 24 to let the air flow into gap 64.

Valve body 73 includes opening portion 72 that extends in the longitudinal direction (the Y axis direction) of valve body 73. As shown in FIG. 5B, FIG. 6B, and FIG. 7, when valve body 73 is in the opened position, opening portion 72 is in fluid communication with ventilation hole 60 of suction member 24 by being located to overlap ventilation hole 60 of suction member 24 in a plan view of the XY plane. As shown in FIG. 5A and FIG. 6A, when valve body 73 is in the closed position, opening portion 72 is not in fluid communication with ventilation hole 60 of suction member 24 by being located not to overlap ventilation hole 60 of suction member 24 in a plan view of the XY plane.

Also, as shown in FIG. 2, FIG. 3, FIG. 5A, and FIG. 6A, when valve body 73 is in the closed position, end portion 73a of valve body 73 at the front side in the depth direction is located to be exposed to end portion 18d of base 18 at the front side in the depth direction.

As shown in FIG. 5A and FIG. 5B, rib 78 having a substantially rectangular frame shape in a plan view of the XY plane is provided on the lower surface of valve body 73. Rib 78 is located between a pair of stoppers 46 of holding cover 22 in the depth direction. When valve body 73 slides from the closed position to the opened position, rib 78 of valve body 73 comes into contact with one of a pair of stoppers 46 of holding cover 22, thereby regulating valve body 73 not to slide beyond the opened position. Meanwhile, when valve body 73 slides from the opened position to the closed position, rib 78 of valve body 73 comes into contact with the other of a pair of stoppers 46 of holding cover 22, thereby regulating valve body 73 not to slide beyond the closed position. This regulates valve body 73 to slide within the range between the closed position and the opened position.

As shown in 6A and FIG. 6B, a pair of engagement portions 76 are located at both ends of valve body 73 in the lateral direction (the X axis direction). When valve body 73 slides from the opened position to the closed position, each of a pair of engagement portions 76 is engaged in a pair of protruded portions 48 of holding cover 22. This provides a user with tactile feedback when the user slides slide valve 30 from the opened position to the closed position. When valve body 73 slides from the closed position to the opened position, each of a pair of engagement portions 76 elastically bends to be released from the engagement with a pair of protruded portions 48 of holding cover 22. This provides the user with tactile feedback when the user slides slide valve 30 from the closed position to the opened position.

Knob 74 is provided at end portion 73b of valve body 73 at the back side in the depth direction. Knob 74 protrudes from the upper surface of valve body 73 toward base 18. Knob 74 is inserted in insertion hole 32 of base 18 in a manner that knob 74 is movable in the depth direction. Stated differently, knob 74 protrudes from upper surface 18b of base 18 in an upward direction through insertion hole 32. The user can slide valve body 73 from the closed position to the opened position by moving knob 74 in the direction indicated by arrow P shown in FIG. 5A. The user can also slide valve body 73 from the opened position to the closed position by moving knob 74 in the direction indicated by arrow Q shown in FIG. 5B.

[3. Operations of Stand]

Figure 8B:
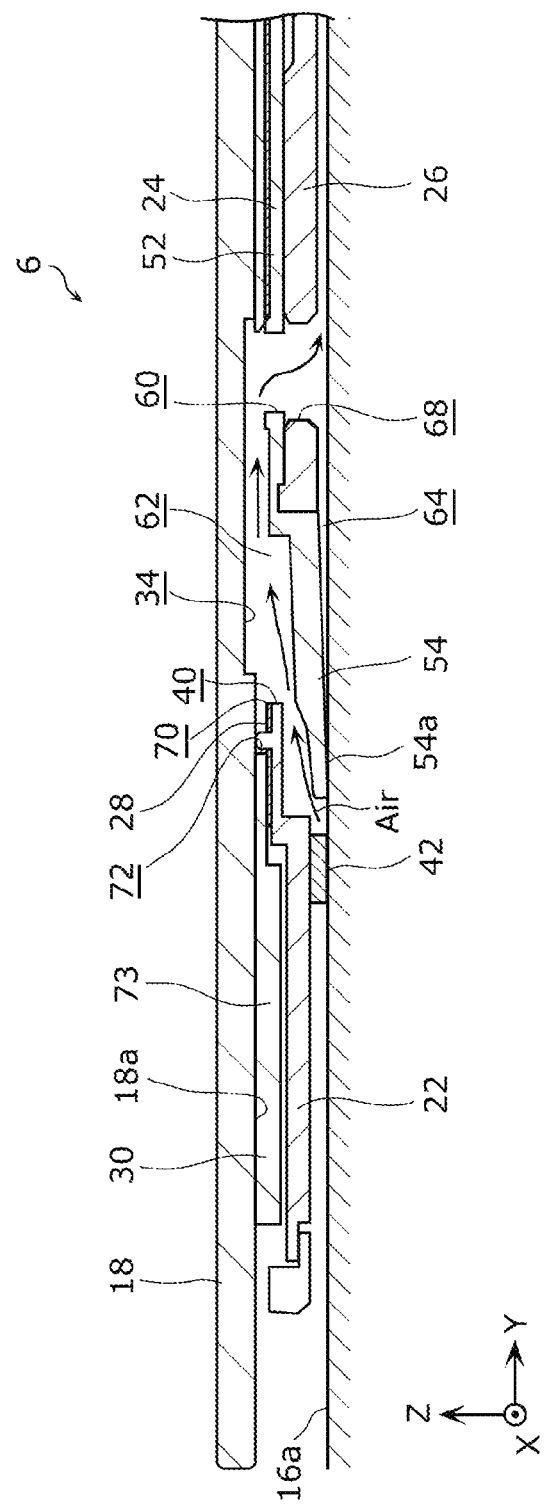
FIG. 8B is a diagram for explaining an operation of the stand according to the embodiment when the slide valve is in the opened position.

With reference to FIG. 8A and FIG. 8B, the operations of stand 6 will be described. FIG. 8A is a diagram for explaining an operation of stand 6 according to the embodiment when slide valve 30 is in the closed position. FIG. 8B is a diagram for explaining an operation of stand 6 according to the embodiment when slide valve 30 is in the opened position.

When slide valve 30 is in the closed position and stand 6 is not under an external force acting in a direction away from placement surface 16a, the outer portion of suction surface 54a of suction portion 54 of suction member 24 is in contact with placement surface 16a. At this time, gap 64 is created between the lower surface of holder 26 and placement surface 16a and between the inner portion of suction surface 54a of suction portion 54 and placement surface 16a. Stated differently, gap 64 is a space enclosed by placement surface 16a, the lower surface of holder 26, suction surface 54a of suction portion 54, ventilation hole 60 of attachment portion 52, and slide valve 30. At this time, suction portion 54 of suction member 24 is pressed against placement surface 16a by the weight of stand 6, as a result of which the volume of gap 64 becomes minimum. In this state, elastic resilience of suction portion 54 works, which is an ability to return to the original shape. The force that presses suction portion 54 against placement surface 16a is, however, greater than such elastic resilience. As such, suction portion 54 of suction member 24 remains in a state in which the volume of gap 64 is minimum, and thus is not deformed by the elastic resilience. Consequently, no negative pressure is generated in gap 64, meaning that the outer portion of suction surface 54a of suction portion 54 does not adhere to placement surface 16a by suction.

Suction portion 54 extends in a skirt shape from the outer periphery of attachment portion 52 in an outer radial direction. For this reason, even when placement surface 16a has asperities, suction portion 54 can deform to fit the asperities of placement surface 16a. This brings the outer portion of suction surface 54a of suction portion 54 into intimate contact with placement surface 16a.

The following considers the case where stand 6 in the foregoing state is under an external force acting in a direction away from placement surface 16a when slide valve 30 is in the closed position as shown in FIG. 8A. Note that example cases where stand 6 is under such an external force include: a) in the event of an earthquake; b) when the user improperly moves placement table 16; and c) when the user's body bumps into device body 4.

In a state shown in FIG. 8A, suction portion 54 of suction member 24 elastically deforms in a direction away from placement surface 16a. As a result, the volume of gap 64 increases to generate negative pressure in gap 64. This causes suction portion 54 to be pressed against placement surface 16a by atmospheric pressure, as a result of which the outer portion of suction surface 54a of suction portion 54 adheres to placement surface 16a by suction. This consequently prevents electronic device 2 from falling over.

The following describes the case where the user lifts electronic device 2 from placement surface 16a of placement table 16. From a state shown in FIG. 8A, the user operates knob 74 (see FIG. 5A and FIG. 5B) to slide slide valve 30 from the closed position to the opened position, as shown in FIG. 8B. This lets the air that has passed through air admission opening 62 flow into gap 64 via opening portion 40 of holding cover 22, opening portion 70 of slip sheet 28, opening portion 72 of slide valve 30, recessed portion 34 of base 18, ventilation hole 60 of attachment portion 52 of suction member 24, and ventilation hole 68 of holder 26. At this time, recessed portion 34 of base 18 serves as a channel through which the air flows into gap 64. This does not allow the generation of negative pressure in gap 64 when stand 6 is under an external force acting in a direction away from placement surface 16a, as a result of the user trying to lift up electronic device 2. The user is thus able to lift electronic device 2 up from placement surface 16a of placement table 16.

Note that instead of the foregoing operations of knob 74, the user may perform an operation described below to slide valve body 73. The user can slide valve body 73 from the closed position to the opened position, when slide valve 30 is in the closed position, by pressing end portion 73a of valve body 73 into the back side in the depth direction (the positive side of the Y axis direction). Meanwhile, the user can slide valve body 73 from the opened position to the closed position, when slide valve 30 is in the opened position, by drawing end portion 73a of valve body 73 toward the front side in the depth direction (the negative side of the Y axis direction) using a hook, etc. The configuration that eliminates knob 74 enhances the design of stand 6, for example, because there is no knob 74 protruding from upper surface 18b of base 18. In this case, the user uses end portion 73a of valve body 73 to slide valve body 73.

[4. Effects]

As described above, in the present embodiment, electronic device 2 is an electronic device placed on placement surface 16a. Electronic device 2 includes: device body 4; and stand 6 that is placed on placement surface 16a and supports device body 4. Stand 6 includes: base 18 including lower surface 18a that faces placement surface 16a; suction member 24 that is elastic, faces lower surface 18a of base 18, includes suction surface 54a that adheres to placement surface 16a by negative pressure generated in gap 64 between placement surface 16a and suction surface 54a, and includes ventilation hole 60 that is in fluid communication with gap 64; and slide valve 30 that is located between base 18 and suction member 24 and slides between an opened position and a closed position along lower surface 18a of base 18, the opened position being a position at which ventilation hole 60 is opened to let air into gap 64, the closed position being a position at which ventilation hole 60 is closed to interrupt air into gap 64. When slide valve 30 is in the closed position, suction member 24 generates the negative pressure in gap 64 by elastically deforming in a direction away from placement surface 16a when the stand is under an external force acting in the direction away from placement surface 16a.

In this configuration, slide valve 30 slides between the opened position and the closed position along lower surface 18a of base 18. This configuration reduces the thickness (the dimension in the Z axis direction) of the valve mechanism for opening and closing ventilation hole 60 of suction member 24. This consequently reduces the thickness of stand 6.

Also, in the present embodiment, stand 6 further includes slip sheet 28 located between slide valve 30 and suction member 24, slip sheet 28 having a slippery property. Slide valve 30 slides between the opened position and the closed position by sliding on slip sheet 28.

This configuration reduces the friction between slide valve 30 and slip sheet 28, thus enabling slide valve 30 to smoothly slide between the opened position and the closed position.

Also, in the present embodiment, slide valve 30 includes: valve body 73 that slides between the opened position and the closed position along a depth direction of electronic device 2; and knob 74 used to slide valve body 73, knob 74 being provided at end portion 73b of valve body 73 at a back side in the depth direction.

This configuration enables knob 74 to be hard to be visible from the front side of electronic device 2 in the depth direction. This consequently improves the design of electronic device 2.

Also, in the present embodiment, base 18 includes insertion hole 32 into which knob 74 is inserted in a manner that knob 74 is movable in the depth direction, insertion hole 32 being located at end portion 18c of base 18 at the back side in the depth direction.

This configuration enables knob 74 to be compactly located, utilizing base 18.

Also, in the present embodiment, end portion 73a of valve body 73 at a front side in the depth direction is located to be exposed to end portion 18d of base 18 at the front side in the depth direction when valve body 73 is in the closed position.

This configuration enables the user to easily slide valve body 73 from the closed position to the opened position by pressing in end portion 73a of valve body 73 at the front side in the depth direction.

Also, in the present embodiment, valve body 73 includes opening portion 72. Opening portion 72 is in fluid communication with ventilation hole 60 when valve body 73 is in the opened position, and is not in fluid communication with ventilation hole 60 when valve body 73 is in the closed position.

This configuration simplifies the configuration of slide valve 30.

Also, in the present embodiment, recessed portion 34 is located in lower surface 18a of base 18, recessed portion 34 serving as a channel through which air flows into gap 64 via opening portion 72 and ventilation hole 60, when valve body 73 is in the opened position.

In this configuration, recessed portion 34 of base 18 serves as a channel through which the air flows, thereby enabling an efficient flow of air into gap 64.

Also, in the present embodiment, stand 6 further includes engagement mechanism 50 for providing tactile feedback when sliding slide valve 30.

This provides the user with tactile feedback when the user slides slide valve 30, thus enabling the user to have an intuitive feeling that the user has slid slide valve 30 from the closed position to the opened position (or from the opened position to the closed position).

Also, in the present embodiment, electronic device 2 is an image display device, and device body 4 includes display panel 8 for image display.

This configuration reduces the thickness of stand 6 of the image display device.

Also, in the present embodiment, stand 6 is placed on placement surface 16a and supports device body 4. Stand 6 includes: base 18 including lower surface 18a that faces placement surface 16a; suction member 24 that is elastic, faces lower surface 18a of base 18, includes suction surface 54a that adheres to placement surface 16a by negative pressure generated in gap 64 between placement surface 16a and suction surface 54a, and includes ventilation hole 60 that is in fluid communication with gap 64; and slide valve 30 that is located between base 18 and suction member 24 and slides between an opened position and a closed position along lower surface 18a of base 18, the opened position being a position at which ventilation hole 60 is opened to let air into gap 64, the closed position being a position at which ventilation hole 60 is closed to interrupt air into gap 64. When slide valve 30 in the closed position, suction member 24 generates the negative pressure in gap 64 by elastically deforming in a direction away from placement surface 16a when stand 6 is under an external force acting in the direction away from placement surface 16a.

In this configuration, slide valve 30 slides between the opened position and the closed position along lower surface 18a of base 18. This configuration thus reduces the thickness of the valve mechanism for opening and closing ventilation hole 60 of suction member 24. This consequently reduces the thickness of stand 6.

Another Embodiment

The embodiment has been described above to illustrate an example of the technology disclosed in the present application. Note, however, that the technology according to the present disclosure is not limited to such embodiment, and thus is applicable to an embodiment obtained by making changes, replacements, additions, omissions, and so forth, where appropriate. Also, structural components described in the embodiment can be combined to serve as a new embodiment.

In view of this, an example of another embodiment will be described below.

In the foregoing embodiment, electronic device 2 is described as a liquid crystal television receiver, but the present disclosure is not limited to this. For example, electronic device 2 may be, for example, a liquid crystal display for a personal computer, an organic electro luminescence (EL) display, or other various image display devices. Alternatively, electronic device 2 may be, for example, a speaker, an electrical fan, an electrical heater, a lighting device (electrical lamp), or other various devices.

In the foregoing embodiment, suction member 24 has a circular shape in a plan view of the XY plane, but the present disclosure is not limited to this. Suction member 24 may thus have, for example, a polygonal shape or an oval shape in a plan view of the XY plane.

In the foregoing embodiment, insertion hole 32 is provided for inserting knob 74 to base 18, but the present disclosure is not limited to this configuration. Knob 74 may thus be inserted, for example, to a notch portion provided on the outer periphery of base 18.

In the foregoing embodiment, end portion 73a of valve body 73 at the front side in the depth direction is located to be exposed to end portion 18d of base 18 at the front side in the depth direction when valve body 73 is in the closed position, but the present disclosure is not limited to this configuration. End portion 73a of valve body 73 may thus be located to be exposed to end portion 18d of base 18 when valve body 73 is in the opened position.

The embodiment has been described above to illustrate an example of the technology according to the present disclosure, for which the accompanying drawings and detailed description have been provided.

To illustrate the above technology, the structural components described in the accompanying drawings and detailed description can thus include not only the structural components essential to solve the problem, but also structural components not essential to solve the problem. Therefore, the fact that such unessential structural components are illustrated in the accompanying drawings and detailed description should not lead to the immediate conclusion that such unessential structural components are essential.

Also note that the foregoing embodiment is intended for illustrating the technology according to the present disclosure, and thus allows for various modifications, replacements, additions, omissions, and so forth made thereto within the scope of the claims and its equivalent scope.

INDUSTRIAL APPLICABILITY

The present disclosure is applicable to an electronic device having a stand. More specifically, the present disclosure is applicable, for example, to an image display device such as a liquid crystal television receiver.

REFERENCE SIGNS LIST 2 electronic device
4 device body
6 stand
8 display panel
8a display surface
10 cabinet
12 front cabinet
14 rear cabinet
16 placement table
16a placement surface
18 base
18a, 22a lower surface
18b, 22b upper surface
18c, 18d, 73a, 73b end portion
20 stand neck
22 holding cover
24 suction member
26 holder
28 slip sheet
30 slide valve
32 insertion hole
34 recessed portion
36 column portion
38 bracket
40, 70, 72 opening portion
42 rubber foot
44, 63 groove portion
46 stopper
48 protruded portion
50 engagement mechanism
52 attachment portion 54 suction portion
54a suction surface
56 screw
58, 66 hole
60, 68 ventilation hole
62 air admission opening
64 gap
73 valve body
74 knob
76 engagement portion
78 rib

The invention claimed is:

1. An electronic device placed on a placement surface, the electronic device comprising:
a device body; and
a stand that is placed on the placement surface and supports the device body,
wherein the stand includes:
a base including a lower surface that faces the placement surface;
a suction member that is elastic, faces the lower surface of the base, includes a suction surface that adheres to the placement surface by negative pressure generated in a gap between the placement surface and the suction surface, and includes a ventilation hole that is in fluid communication with the gap; and
a slide valve that is located between the base and the suction member and slides between an opened position and a closed position along the lower surface of the base, the opened position being a position at which the ventilation hole is opened to let air into the gap, the closed position being a position at which the ventilation hole is closed to interrupt air into the gap, and
when the slide valve is in the closed position, the suction member generates the negative pressure in the gap by elastically deforming in a direction away from the placement surface when the stand is under an external force acting in the direction away from the placement surface.

2. The electronic device according to claim 1,
wherein the stand further includes a slip sheet located between the slide valve and the suction member, the slip sheet having a slippery property, and
the slide valve slides between the opened position and the closed position by sliding on the slip sheet.

3. The electronic device according to claim 1,
wherein the slide valve includes:
a valve body that slides between the opened position and the closed position along a depth direction of the electronic device; and
a knob used to slide the valve body, the knob being provided at an end portion of the valve body at a back side in the depth direction.

4. The electronic device according to claim 3,
wherein the base includes an insertion hole into which the knob is inserted in a manner that the knob is movable in the depth direction, the insertion hole being located at an end portion of the base at the back side in the depth direction.

5. The electronic device according to claim 3,
wherein an end portion of the valve body at a front side in the depth direction is located to be exposed to an end portion of the base at the front side in the depth direction when the valve body is in one of the opened position and the closed position.

6. The electronic device according to claim 3,
wherein the valve body includes an opening portion, and the opening portion is in fluid communication with the ventilation hole when the valve body is in the opened position, and is not in fluid communication with the ventilation hole when the valve body is in the closed position.

7. The electronic device according to claim 6,
wherein a recessed portion is located in the lower surface of the base, the recessed portion serving as a channel through which air flows into the gap via the opening portion and the ventilation hole, when the valve body is in the opened position.

8. The electronic device according to claim 3,
wherein the stand further includes an engagement mechanism for providing tactile feedback when sliding the slide valve.

9. The electronic device according to claim 1,
wherein the electronic device is an image display device, and
the device body includes a display panel for image display.

10. A stand placed on a placement surface and supports a device body, the stand comprising:
a base including a lower surface that faces the placement surface;
a suction member that is elastic, faces the lower surface of the base, includes a suction surface that adheres to the placement surface by negative pressure generated in a gap between the placement surface and the suction surface, and includes a ventilation hole that is in fluid communication with the gap; and
a slide valve that is located between the base and the suction member and slides between an opened position and a closed position along the lower surface of the base, the opened position being a position at which the ventilation hole is opened to let air into the gap, the closed position being a position at which the ventilation hole is closed to interrupt air into the gap, and
when the slide valve in the closed position, the suction member generates the negative pressure in the gap by elastically deforming in a direction away from the placement surface when the stand is under an external force acting in the direction away from the placement surface.

* * * * *